United States Patent [19]

Scott

[11] Patent Number: 4,672,233
[45] Date of Patent: Jun. 9, 1987

[54] CONTROLLER WITH DUAL FUNCTION SWITCH

[75] Inventor: Charles E. Scott, Noblesville, Ind.

[73] Assignee: Emhart Industries, Inc., Indianapolis, Ind.

[21] Appl. No.: 747,915

[22] Filed: Jun. 24, 1985

[51] Int. Cl.⁴ .......................................... H01H 36/00
[52] U.S. Cl. .................................. 307/141; 307/141.4; 307/116; 307/132 E; 307/597; 340/309.4
[58] Field of Search ................. 307/141, 141.4, 590, 307/593, 595, 596, 597, 600, 601, 603, 112, 113, 114, 115, 116, 117, 129, 130, 139; 318/431, 445, 452, 484, 442, 443, 446; 340/309.4, 309.15; 134/56 R, 56 D, 57 R, 57 D, 58 R, 58 D

[56] References Cited

U.S. PATENT DOCUMENTS

| | | | |
|---|---|---|---|
| 3,396,282 | 8/1968 | Shen et al. | 307/597 X |
| 3,601,636 | 8/1971 | Marsh | 307/595 X |
| 3,767,937 | 10/1973 | Schmidgall | 307/141 X |
| 3,786,357 | 1/1974 | Belle Isle | 307/595 X |
| 3,910,594 | 10/1975 | Joneleit | 307/600 X |
| 4,062,007 | 12/1977 | Scott | 307/141 X |
| 4,194,230 | 3/1980 | Danford | 307/129 X |
| 4,234,801 | 11/1980 | Small | 307/115 X |
| 4,239,987 | 12/1980 | Heffeman | 307/603 X |
| 4,306,270 | 12/1981 | Miller et al. | 361/90 X |
| 4,331,890 | 5/1982 | Makino et al. | 307/115 X |
| 4,498,019 | 2/1985 | Berger | 307/132 E |
| 4,500,795 | 2/1985 | Hochstein et al. | 307/141 |
| 4,521,722 | 6/1985 | Barthel et al. | 307/141 X |

Primary Examiner—William M. Shoop, Jr.
Assistant Examiner—Shik Luen Paul Ip
Attorney, Agent, or Firm—Robert F. Meyer; Carl A. Forest

[57] ABSTRACT

A machine controller having start and time delay functions activated and set by a single switch. There is a cycler for activating and deactivating machine functions in a timed sequence. There is a manually operable start/delay-set switch and an electronic circuit responsive to the switch which produces a start signal upon initial closing of the switch, and which produces a delay signal after the switch is held closed for a predetermined time. An electronic control circuit responds to the start and delay signals to store a delay time and activate the cycler after the stored delay time has expired.

3 Claims, 2 Drawing Figures

CONTROLLER WITH DUAL FUNCTION SWITCH

BACKGROUND OF THE INVENTION

1. Field of the Invention

The invention, in general, relates to electromechanical timers and more particularly to a timer having a start and a delay function and in which both the start and the delay time set functions are activated by the same switch.

2. Description of the Prior Art

Timers of the general nature to which the present invention relates are well known to those skilled in the art and have been employed in appliances such as dishwashers, washing machines, and other machines to activate and deactivate various machine functions in a sequence of timed events determined by a cycle of operation of the machine which has been selected by the user. Generally, the machine functions are controlled by an array of switches located on a machine control panel. The switches may be used to select a cycle, add or delete a specific function during a cycle, program a particular parameter to be incorporated into the cycle, and for other functions. As the complexity and number of the functions that machines such as dishwashers and clothes washers can perform have multiplied, so too have the number of switches on the machine control panels. As the number of switches has grown, it has become desirable to eliminate or combine switches.

The switches on the control panels of such machines generally include a start switch, which when pushed causes the machine to start the selected cycle of operation. With the increased recognition for the enhanced control of energy sources, it has become desirable to have appliances and other such machinery which consume large quantities of power to be operated during non-peak periods of power consumption. These non-peak periods of power consumption naturally occur when it is most inconvenient for the user of the appliance or machine to be present to activate the machine. Thus, modern machines, such as dishwashers, incorporate a delay function, which permits the user to delay the start of the cycle until an off-peak period. The delay function is generally selected by pushing a delay switch which activates a delay time set function.

SUMMARY OF THE INVENTION

It is an object of the present invention to provide a machine controller in which the separate start and delay time set switches of the prior art controllers are replaced by a single dual function switch.

It is a further object of the invention to provide dual function switch circuitry which is compatible with the prior art controllers; i.e. the dual function switch circuitry "fools" the prior art controllers into operating as if separate start and time delay switches are still present, even though they have been combined into a single switch.

It is a further object of the invention to provide one or more of the above objects utilizing circuitry that costs approximately the same or less than the switch which is eliminated.

It is yet another object of the present invention to provide a controller in which the number of switches is reduced without reducing the number of functions provided or the convenience and ease of use.

The invention provides an apparatus for controlling a machine having an operating cycle, comprising a cycle control means for activating and deactivating a plurality of machine functions in a timed sequence, a manually operable switch, means responsive to the switch for producing a start signal and for producing a delay signal only after the switch is held closed for a predetermined time, means responsive to the delay signal for storing a delay time, and means communicating with the means for storing for activating the cycle control means after the stored delay time. Preferably the means for producing a start signal includes a means for turning off the start signal after the predetermined time. In the preferred embodiment, the means for producing a start signal and a delay signal further includes a means for postponing initiation of the delay signal until after the start signal has been turned off.

The preferred embodiment of the invention comprises four NAND gates, a pair of transistors and less than a dozen resistors and capacitors, which, when incorporated into microcircuitry, takes up less space and are less expensive than the switch replaced, and at the same time the circuit so completely mimics a two-switch circuit that it can simply be substituted for the two switches in the prior art systems with no further alteration of the timing control circuitry. Numerous other features, objects and advantages of the invention will become apparent from the following detailed description when read in conjunction with the accompanying drawings.

DESCRIPTION OF THE PREFERRED EMBODIMENT

Figure 1:
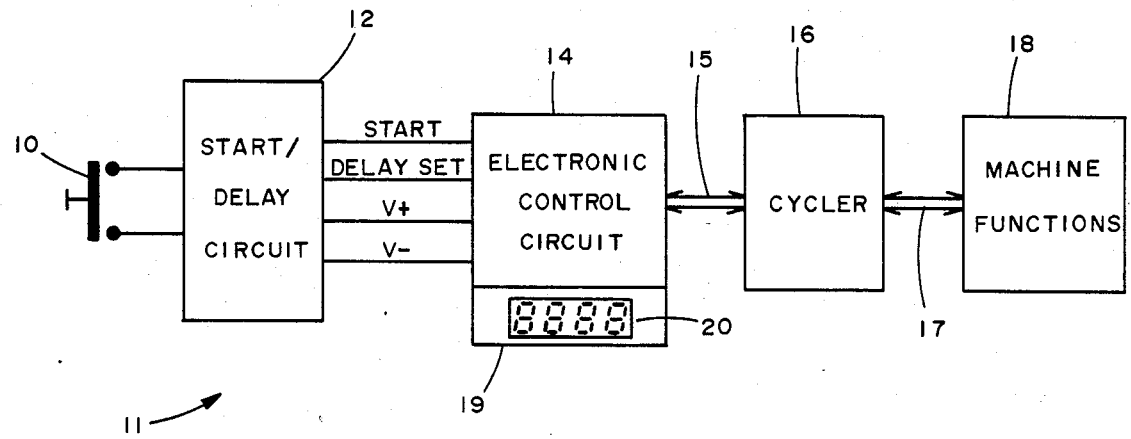
FIG. 1 is a block diagram of the machine controller according to the invention.

Directing attention to FIG. 1, a block diagram of a controller according to the preferred embodiment of the invention is shown. The controller includes a pushbutton type switch 10 which is connected to Start-/Delay Circuitry 12, which mimics the function of the start and the delay set switches in the prior art circuitry and provides a start and a delay signal to an Electronic Control circuit 14. The Electronic Control Circuit 14 controls a Cycler 16 which in the preferred embodiment is an electromechanical device having motors which drive cams which open and close electrical contacts for operating the machine functions. The connection 15 and 17 between the Electronic Control Circuit 14 and the Cycler 16 and the Cycler 16 and the machine functions 18, respectively, are shown as broad, dual-tipped arrows to indicate that numerous electrical and mechanical connections carrying signals both ways are involved at each interface.

The Electronic Control Circuit 14, and the Cycler 16 may be any conventional electronic control circuit and cycler incorporating both a start and a delay function, for example that described in U.S. Pat. No. 4,062,007 issued to the this inventor and that incorporated in commercially available circuits such as part No. 091-58518 sold by Mallory Timers Company, 3029 East Washington St., Indianapolis, Ind. 46206. These Electronic Controller Circuits generally include a means 19 responsive to the delay set signal for storing a display time and for activating the Cycler 16 after the stored delay time has expired. Generally, associated with the means 19 for storing is a display 20 for displaying the delay time. The machine functions 18 which are controlled by the controller 11 are conventional and well known in the art and will not be further described.

Figure 2:
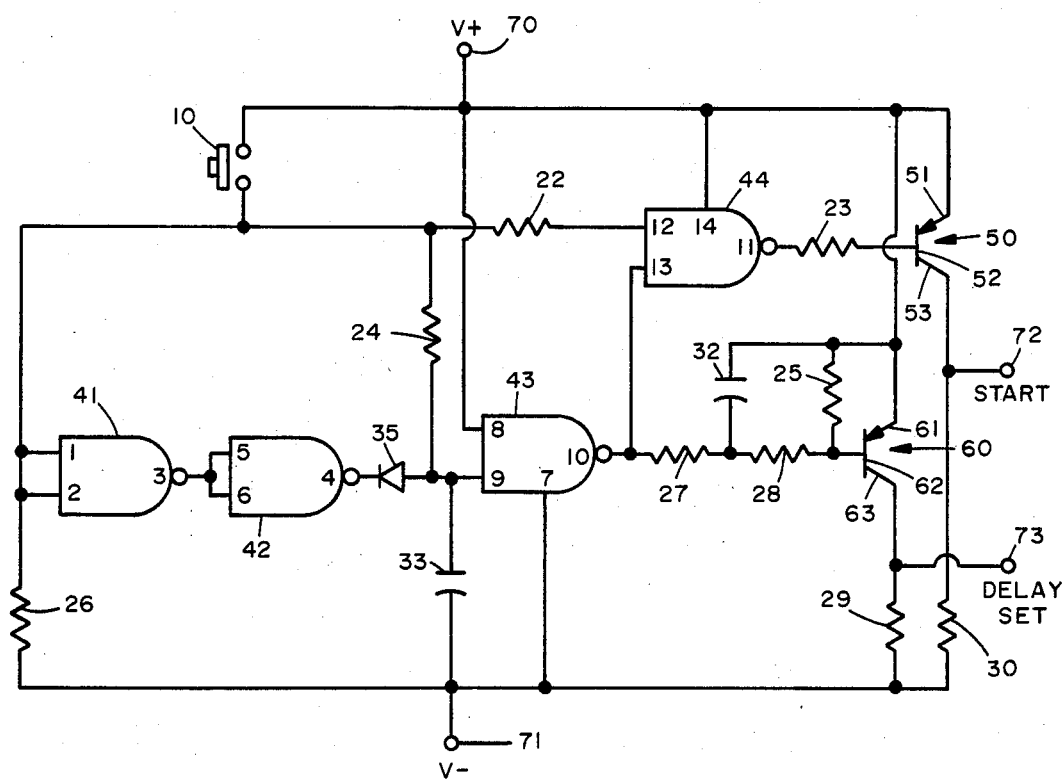
FIG. 2 is a detailed electronic circuit diagram of the preferred embodiment of the Start/Delay Circuitry according to the invention.

Turning now to FIG. 2, there is shown the detailed circuitry of the Start/Delay circuitry 12 according to the preferred embodiment of the invention. The electronic components of this embodiment include switch 10, 56K ohm resistors 22, 23, 26, and 28, 1.5 M ohm resistor 24, 10K ohm resistor 25, 100K ohm resistors 27, 29, and 30, one microfarad capacitors 32 and 33, type IN5605 diode 35, NAND gates 41, 42, 43, and 44, which are preferably part of a QUAD NAND gate type CD4011B, and two type 2N3906 transistors 50 and 60. Note that the numbers within the gates 41 through 44 indicate the pin number of the QUAD NAND gate.

The Start/Delay Circuit 12 is powered by a conventional voltage source which is generally contained within the Electronic Control Circuit 14 (FIG. 1). The voltage inputs are indicated as V+ (high) and V− (low). Returning to FIG. 2, V+ is input at terminal 70 and V− at terminal 71. Terminal 70 is connected to one side of switch 10, pins 14 and 8 of the QUAD NAND gate, and the emitters 51 and 61 of transistors 50 and 60. Terminal 71 is connected to pin 7 of the QUAD NAND gate, pin 9 of the gate through capacitor 33, pins 1 and 2 of the gate and the other side of switch 10 through resistor 26, and to the collectors 53 and 63 of transistors 50 and 60, respectively, through resistors 30 and 29, respectively. The low side of switch 10 is connected to pin 12 of the QUAD NAND gate through resistor 22 and pin 9 through resistor 24. The output of NAND gate 41 (pin 3 of the QUAD gate) is connected to the inputs of gate 42 (pins 5 and 6 of the QUAD gate) and the output of gate 42 (pin 4) is applied to the cathode of diode 35. The anode of diode 35 is applied to pin 9 of the QUAD gate which is one of the inputs of gate 43. The output of gate 43 (pin 10 of the QUAD gate) is applied to one input of gate 44 (pin 13 of the QUAD gate) and to the base 62 of transistor 60 through resistors 27 and 28. Capacitor 32 is connected between resistors 27 and 28 and terminal 70. Resistor 25 is connected between terminal 70 and the base 62 of transistor 60. The output of gate 44 (pin 11 of the QUAD gate) is applied to the base 52 of transistor 50. The collector 53 of transistor 50 is connected to the START output terminal 72, and the collector 63 of transistor 60 is connected to the DELAY SET output terminal 73.

Turning now to the operation of the invention, when switch 10 is not pressed, pin 8 (gate 43) will be at V+ and pin 9 of the same gate will be at V−. The output of NAND gate 43 will thus be a logic 1 (high) as will be pin 13 of gate 44. The other input of gate 44, pin 12, will be low (V−). The output of gate 44 will therefore be high, which will hold transistor 50 in the off condition. Transistor 60 also will be off due to the high output of gate 43.

When the button of switch 10 is pressed and the switch is closed, pin 12 of gate 44 will go high, the output of the gate will go low and transistor 50 will turn on, applying a high signal to the START output. The Electronic Control Circuit 14 will respond to the signal as it would to a high signal produced by the closing of a conventional START switch.

If switch 10 is held in, capacitor 33 begins to charge. After a time determined by the circuit composed of resistance 24 and capacitance 33 (about one second in this embodiment) input 9 will reach the threshold voltage of gate 43 and the output of the gate will go low. The low output of gate 43 applied to the number 13 pin of gate 44 will cause the gate's output to go high shutting off transistor 50, which in turn causes the signal on the START output to go low. After a time determined by the resistances 25, 27 and 28 and capacitance 32, which in this embodiment is about 50 milliseconds, the base 62 of transistor 60 is pulled low by the output of gate 43 and transistor 60 turns on, applying a high signal to the DELAY SET output 73. Electronic Control Circuit 14 will respond to this signal in the same manner as it responds to the high signal produced by the pushing of the DELAY SET button in a conventional design: it will store the delay time and display it on display 20 with the delay time increasing with the length of time that the Delay Set Signal is high. The turning on of transistor 60 is postponed until after the turning off of transistor 50 so that electronic control circuit 14 does not see both the START and DELAY SET "switches" "on" at the same time, which it would generally interpret as an error.

While switch 10 is held in, the voltage at pins 1 and 2 of gate 41 is high. This causes the output of gate 41 (pin 3) to be low. The output of gate 41 is connected to the input of gate 42. Thus the input to gate 42 is low and the output of gate 42 (pin 4) is high. This high output is applied to the cathode of diode 35 effectively blocking the current path through diode 35. When switch 10 is released, the voltage on pins 1 and 2 of gate 41 goes low. This causes the output of gate 41 to be high, the input of gate 42 to be high, and the output of gate 42 to go low. When the output of gate 42 goes low, diode 35 is free to conduct and capacitor 33 immediaely discharges through diode 35. This action causes the voltage on pins 8 and 9 of gate 43 and pins 12 and 13 of gate 44 to return to those given above for the "not pressed" condition, and transistor 60 turns off while transistor 50 remains off. The turning off of transistor 60 puts a low signal on the DELAY SET output 73, terminating the setting of the delay time. Electronic Control Circuit 14 then counts down the delay time, indicating the time remaining until the machine cycle is started on display 20, and starts the Cycler 16 when the delay time has expired.

A novel circuit which permits replacement of the START and DELAY SET switches in a machine controller with a single switch and which is inexpensive to manufacture, has been described. It is evident that those skilled in the art may now make many uses and modifications of the specific embodiment described, without departing from the invention concepts. For example, other equivalent electronic parts may be used. Consequently, the invention is to be construed as embracing each and every novel feature and novel combination of features present in the machine controller described.

What is claimed is:

1. Apparatus for controlling a machine having an operating cycle, comprising:
   a cycle control means for activating and deactivating a plurality of machine functions in a timed sequence,
   a manually operable switch,
   means responsive to said switch for producing a start signal and for producing a delay signal only after said switch is held closer for a predetermined time,
   means responsive to said delay signal for storing a delay time, and means communicating with said means for storing for activating said cycle control means after said delay time.

2. The apparatus of claim 1 wherein said means for producing a start signal includes means for turning off said start signal after said switch is held closed for said predetermined time.

3. The apparatus of claim 1 wherein said means for producing a start signal and a delay signal further includes a means for postponing the initiation of said delay signal until after said start signal has been turned off.

* * * * *